United States Patent
Zhang et al.

(10) Patent No.: US 8,544,651 B2
(45) Date of Patent: Oct. 1, 2013

(54) WAFER TRANSFER POD FOR REDUCING WAFER PARTICULATE CONTAMINATION

(75) Inventors: Ying Zhang, Hsinchu (TW); Tien-Chih Cheng, Hsinchu (TW); Shu-Huei Suen, Jhudong Township (TW); Yu-Cheng Liu, Zhubei (TW); Jian-Huah Chiou, New Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/354,969

(22) Filed: Jan. 20, 2012

(65) Prior Publication Data

US 2013/0186803 A1   Jul. 25, 2013

(51) Int. Cl.
*B65D 81/02* (2006.01)
*B65D 81/18* (2006.01)

(52) U.S. Cl.
USPC ............ 206/710; 206/711; 206/723

(58) Field of Classification Search
USPC ............ 206/711, 710, 723, 722, 832, 454, 206/213.1; 211/41.18
See application file for complete search history.

(56) References Cited

U.S. PATENT DOCUMENTS

| | | | | |
|---|---|---|---|---|
| 5,346,518 A * | 9/1994 | Baseman et al. | | 96/126 |
| 5,879,458 A * | 3/1999 | Roberson et al. | | 118/715 |
| 6,249,990 B1 * | 6/2001 | Tannous et al. | | 34/402 |
| 6,899,145 B2 * | 5/2005 | Aggarwal | | 141/11 |
| 6,981,594 B1 * | 1/2006 | Sarver | | 206/710 |
| 7,334,691 B2 * | 2/2008 | Liu | | 211/41.18 |
| 7,658,289 B2 * | 2/2010 | Sumi et al. | | 206/710 |
| 2008/0164173 A1 * | 7/2008 | Savakus | | 206/454 |
| 2009/0230019 A1 * | 9/2009 | Yang et al. | | 206/711 |
| 2011/0062052 A1 * | 3/2011 | Ku et al. | | 206/711 |
| 2011/0210041 A1 * | 9/2011 | Okabe et al. | | 206/710 |
| 2011/0266181 A1 * | 11/2011 | Morozov | | 206/456 |

* cited by examiner

*Primary Examiner* — Steven A. Reynolds
(74) *Attorney, Agent, or Firm* — Lowe Hauptman & Ham, LLP

(57) ABSTRACT

A wafer transport pod for storing or transporting semiconductor wafers during semiconductor wafer processing includes a body having a top panel, a bottom panel, a back panel, two side panels and a front panel. The two side panels are configured for receiving the semiconductor wafers therebetween. The two side panels have a plurality of separately hermetically sealed partitions inside the body, any two of the sealed partitions for sealing a wafer therebetween and for preventing wafer contamination. The front panel provides ingress and egress for the semiconductor wafers to and from the wafer transport pod.

17 Claims, 2 Drawing Sheets

WAFER TRANSFER POD FOR REDUCING WAFER PARTICULATE CONTAMINATION

FIELD

The disclosure relates generally to the structure of a substrate transport pod suitable for storing or transporting objects such as semiconductor wafers in semiconductor wafer manufacturing and, more particularly, to a wafer transfer pod for reducing wafer particulate contamination.

BACKGROUND

In the semiconductor wafer manufacturing environment, in order to protect the wafers from particulate contaminants from ambient sources, the wafers are transported and temporarily stored in hermetically-sealed containers. The hermetically-sealed container for wafers is referred to as a front-opening unified pod (FOUP) and its specifications are standardized internationally. Although the FOUP protects the wafers from chemical contaminants, particulates, and gases from entering inside the container, the FOUP does not protect the wafers from contaminants that may transfer back to the surfaces of the wafers in subsequent process steps as the wafers are removed and returned to the FOUP. For example, contaminants and particles that adhere to the backside of wafer surfaces or to the interior surfaces of the FOUP may fall onto the topside of wafers positioned lower in the FOUP. Also, chemical gases from wafer processing may condense on the topside of wafers or the interior surfaces of the FOUP to cross contaminate other wafers. Such cross-contamination can result in low production yields or loss of the wafers due to defects during the manufacturing process. The problem becomes more acute as the technology node advances where more process steps are involved and the pitch shrinks.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
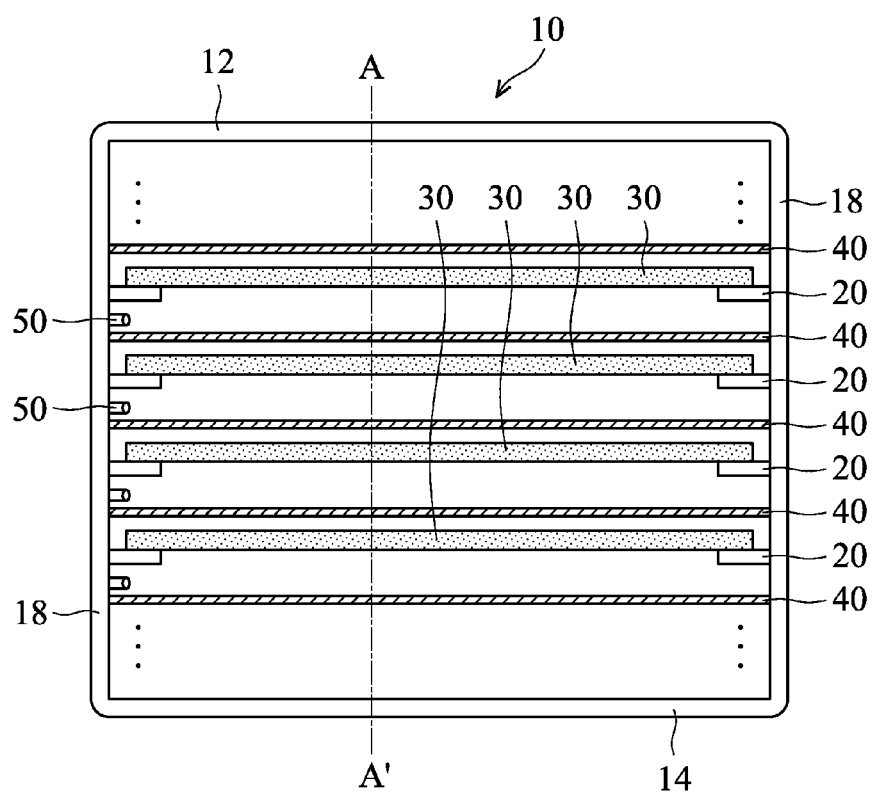
FIG. 1 is a front view of the substrate transport pod, according to various aspects of the present disclosure.
Figure 2:
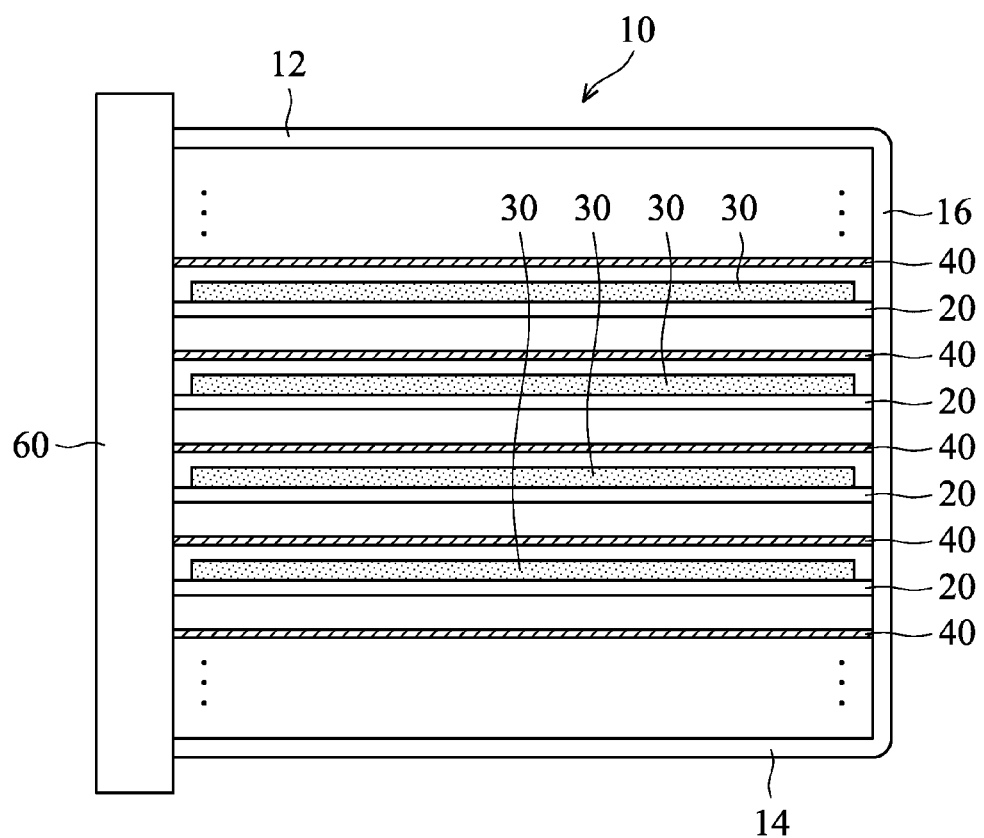
FIG. 2 is a side view of the substrate transport pod of FIG. 1, taken through line A-A'.

FIGS. 1 and 2 show a substrate transport pod 10 according to an embodiment of the present disclosure. FIG. 1 is a front view of the substrate transport pod 10, according to various aspects of the present disclosure and FIG. 2 is a side view of the substrate transport pod of FIG. 1, taken through line A-A'. The substrate transport pod 10 comprises a top panel 12, a bottom panel 14, a back panel 16, and two side panels 18 forming the pod's main body. A front panel 60 may be provided for the door that opens to allow a plurality of wafers 30 to be placed within or removed from the substrate transport pod 10.

To address the wafer substrate cross-contamination problems associated with conventional FOUPs, the FOUP of the present disclosure is fitted with individually hermetically sealed partitions on the inside of the main body of the transfer pod 10 for preventing particulate contamination on the wafers 30. In the example shown in FIGS. 1 and 2, the two side panels 18 for receiving the wafers 30 therebetween have a plurality of separately sealed partitions 40 and at least two partitions 40 seals an individual wafer 30 positioned therebetween from contaminants, particulates, and/or chemical gases, according to one embodiment. In some embodiments, the distance between any two of the sealed partitions 40 may vary in order to accommodate n numbers of wafers 30 in the transfer pod 10. In some embodiments, the transfer pod 10 further comprises one or more supports 20 configured between any two partitions 40, each of the supports 20 adapted for supporting a wafer 30.

The FOUP of the present disclosure protects wafers 30 from contaminants that may transfer back to the surfaces of the wafers in subsequent process steps as the wafers are removed and returned to the FOUP. Contaminants and particles that adhere to the backside of the surfaces of wafer 30 or to the interior surfaces of the FOUP will be prevented from falling on the wafer underneath due to the individually sealed partitions 40. Chemical gases from wafer processing that may condense on the topside of wafers or the interior surfaces of the FOUP will likewise be prevented from cross contaminating other wafers due to the sealed partitions 40.

The particular material selection for the individual sealed partitions 40 will depend on the conditions of a particular wafer substrate manufacturing environment and its requirements. However, the individual sealed partitions 40 of the present disclosure can be made with any material compatible with the particular substrate manufacturing environment as long as chemical contaminants, particulates, and/or chemical gases are prevented from cross-contaminating individual wafers 30 in the FOUP.

The separately sealed partitions 40 may be integral to the body of the wafer transfer pod 10, in one embodiment. In another embodiment, the sealed partitions 40 are separately coupled to the body of the wafer transfer pod 10.

The wafer transfer pod 10 may also contain nozzles for the transfer of gas to or from the FOUP. In one embodiment, the wafer transfer pod 10 comprises a gas inlet 50 between any two of the plurality of separately sealed partitions 40, for transferring gas to or from the transfer pod 10. Although not shown, a gas supply unit supplies gas through the gas inlet 50 and extracts air or gas from between any two of the sealed partitions 40 of the transfer pod 10.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A wafer transport pod for storing or transporting semiconductor wafers during semiconductor wafer processing, the wafer transport pod comprising:
    a body having
        a top panel;
        a bottom panel;
        a back panel;
        two side panels for receiving the semiconductor wafers therebetween, wherein the two side panels have a plurality of separately hermetically sealed partitions inside the body, any two of the sealed partitions for sealing a wafer therebetween and for preventing wafer contamination; and
        a front panel providing ingress and egress for the semiconductor wafers to and from the wafer transport pod;
    wherein the wafer transport pod is a front-opening unified pod (FOUP).

2. The wafer transport pod of claim 1, further comprising one or more supports between any two of the plurality of the partitions, the supports configured to support the wafers.

3. The wafer transport pod of claim 1, wherein each of the separately sealed partitions are integral to the body of the wafer transfer pod.

4. The wafer transport pod of claim 1, wherein the sealed partitions are separately coupled to the body of the wafer transfer pod.

5. The wafer transport pod of claim 1, wherein
    the side panels connect the top panel to the bottom panel, and
    the side panels, the top panel and bottom panel connect the back panel to the front panel when the front panel is in a closed position to hermetically seal the inside of the body from an environment outside the transfer pod.

6. The wafer transport pod of claim 5, wherein each of the partitions extends from one of the side panels to the other side panel, and from the back panel to the front panel when the front panel is in the closed position.

7. The wafer transport pod of claim 1, wherein the partitions extend transversely to the back panel.

8. A wafer transport pod for storing or transporting semiconductor wafers during semiconductor wafer processing, the wafer transport pod comprising:
    a body having
        a top panel;
        a bottom panel;
        a back panel;
        two side panels for receiving the semiconductor wafers therebetween, wherein the two side panels have a plurality of separately hermetically sealed partitions inside the body, any two of the sealed partitions for sealing a wafer therebetween and for preventing wafer contamination;
        a front panel providing ingress and egress for the semiconductor wafers to and from the wafer transport pod; and
        a gas inlet between any two of the plurality of separately sealed partitions, the gas inlet configured to transfer gas to or from the wafer transport pod.

9. A wafer transport pod for storing or transporting semiconductor wafers during semiconductor wafer processing, the wafer transport pod comprising:
    a main body having
        a top panel;
        a bottom panel;
        a back panel;
        two side panels for receiving the semiconductor wafers therebetween, wherein the two side panels have a plurality of individually hermetically sealed partitions inside the main body, any two of the sealed partitions for sealing a wafer therebetween and for preventing wafer contamination;
        one or more supports between any two of the plurality of individually sealed partitions to support the wafers;
        a door providing ingress and egress for the semiconductor wafers to and from the wafer transport pod; and
        a gas inlet between any two of the plurality of individually sealed partitions, the gas inlet configured to transfer gas to or from the wafer transport pod.

10. The wafer transport pod of claim 9, wherein each of the individually sealed partitions are integral to the body of the wafer transfer pod.

11. The wafer transport pod of claim 9, wherein the sealed partitions are separately coupled to the body of the wafer transfer pod.

12. The wafer transport pod of claim 9, wherein
    the side panels connect the top panel to the bottom panel, and
    the side panels, the top panel and bottom panel connect the back panel to the door when the door is in a closed position to hermetically seal the inside of the body from an environment outside the transfer pod.

13. The wafer transport pod of claim 12, wherein each of the partitions extends from one of the side panels to the other side panel, and from the back panel to the door when the door is in the closed position.

14. The wafer transport pod of claim 9, wherein the partitions extend transversely to the back panel.

15. A wafer transport pod for storing or transporting semiconductor wafers during semiconductor wafer processing, the wafer transport pod comprising:
    a main body having
        a top panel;
        a bottom panel;
        a back panel;
        two side panels for receiving the semiconductor wafers therebetween, wherein the two side panels have a plurality of individually hermetically sealed partitions inside the main body, any two of the sealed partitions for sealing a wafer therebetween and for preventing wafer contamination;
        one or more supports between any two of the plurality of individually sealed partitions to support the wafers; and
        a door providing ingress and egress for the semiconductor wafers to and from the wafer transport pod;
    wherein the wafer transport pod is a front-opening unified pod (FOUP).

16. A wafer transport pod for storing or transporting semiconductor wafers during semiconductor wafer processing, the wafer transport pod comprising:
    a body having
        a top panel;

a bottom panel;

a back panel;

two side panels for receiving the semiconductor wafers therebetween, the side panels connecting the top panel to the bottom panel;

a front panel defining a door that provides ingress and egress for the semiconductor wafers to and from an inside of the body, the side panels, the top panel and bottom panel connecting the back panel to the door when the door is closed to hermetically seal the inside of the body from an environment outside the body; and a plurality of partitions each extending from one of the side panels to the other side panel, and from the back panel to the door when the door is closed, the partitions dividing the inside of the body into a plurality of compartments for receiving the semiconductor wafers;

wherein the wafer transport pod is a front-opening unified pod (FOUP).

17. The wafer transport pod of claim 16, wherein each of the compartments is hermetically sealed from the other compartments when the door is closed for preventing cross-contamination among the semiconductor wafers.

* * * * *